United States Patent [19]
Emerson et al.

[11] Patent Number: 5,106,771
[45] Date of Patent: Apr. 21, 1992

[54] GAAS MESFETS WITH ENHANCED SCHOTTKY BARRIER

[75] Inventors: Adrian B. Emerson, Piscataway; Fan Ren, Warren, both of N.J.

[73] Assignee: AT&T Bell Laboratories, Murray Hill, N.J.

[21] Appl. No.: 710,594

[22] Filed: Jun. 5, 1991

[51] Int. Cl.$^5$ .......................................... H01L 21/265
[52] U.S. Cl. ........................................ 437/40; 437/41; 437/176; 437/179; 437/912
[58] Field of Search ................... 437/40, 41, 176, 179, 437/912; 148/DIG. 139, DIG. 140

[56] References Cited

U.S. PATENT DOCUMENTS

| | | | |
|---|---|---|---|
| 4,662,060 | 5/1987 | Aina et al. | 148/DIG. 140 |
| 4,735,913 | 4/1988 | Hayes et al. | 437/912 |
| 4,762,806 | 8/1988 | Suzuki et al. | 437/912 |
| 4,782,031 | 11/1988 | Hagio et al. | 437/912 |
| 4,849,376 | 7/1989 | Balzen et al. | 437/179 |
| 4,863,879 | 9/1989 | Kwok | 437/912 |
| 4,965,218 | 10/1990 | Geissberger | 437/912 |
| 4,981,809 | 1/1991 | Mitsuaki et al. | 437/912 |

OTHER PUBLICATIONS

S. J. Eglash et al., *Journal of Applied Physics*, vol. 61, No. 11, Jun. 1, 1987, pp. 5159–5169.
J. R. Waldrop and R. W. Grant, *Appl. Phys. Lett.*, vol. 52, No. 21 (May 23, 1988) pp. 1794–1796.
J. M. Woodall and J. L. Freeouf, *J. Vac. Sci. Technol.*, vol. 21, No. 2, (Jul./Aug. 1982) pp. 574–576.
E. H. Rhoderick and T. H. Williams, "Metal-Semiconductor Contacts," Oxford *Science Publications*, Oxford, 2nd ed., 1988, pp. 10–11 and 48.
H. Iwasaki et al., "X-Ray Photomission Study of Interaction of Oxygen . . .", *Japanese Journal of Applied Physics*, vol. 17, No. 2, Feb. 1978, pp. 315–320.

*Primary Examiner*—Brian E. Hearn
*Assistant Examiner*—Kevin M. Picardat
*Attorney, Agent, or Firm*—Oleg E. Alber

[57] ABSTRACT

This invention is concerned with the production of Schottky barrier gate contacts in MESFET devices. The contact is produced by wet-chemical removal of native oxide in a sealed inert gas ambient and blow-drying the wet-etched surface with the inert gas prior to deposition of gate electrode metal on GaAs by electron beam evaporation in an inert gas ambient. Use of Pt, due to its higher metal work function, as the gate contact metal results in a Schottky barrier height of 0.98 eV for Pt on n-type GaAs. This is considerably higher than the barrier height of conventionally processed TiPtAu contacts (0.78 eV). To lower the sheet resistivity of the gate contact, Pt is preferably used as a milti-layer contact in combination with metal having lower sheet resistivity, with Pt being in direct contact with the n-type GaAs surface, MESFETs fabricated using PtAu bilayer contacts show reverse currents an order of magnitude lower than TiPtAu-contacted companion devices, higher reverse breakdown voltages and much lower gate leakage. The use of this technology of native oxide removal and the PtAu bilayer contact provides a much simpler method of enhancing the barrier height on n-type GaAs than other techniques such as counter-doping the near-surface or inserting an interfacial layer.

14 Claims, 6 Drawing Sheets

GAAS MESFETS WITH ENHANCED SCHOTTKY BARRIER

FIELD OF THE INVENTION

This invention is concerned with GaAs MESFETs with enhanced Schottky barrier.

BACKGROUND OF THE INVENTION

Field Effect Transistor (FET) is a three-terminal device in which the current through two terminals (drain and source) is controlled by a voltage at a third terminal (gate). FET is a unipolar device, that is, the current involves only majority carriers. One variant of the FET is a Junction FET (JFET) in which the control (gate) voltage varies the depletion width of a reverse-biased p-n junction. A similar device results if the p-n junction is replaced by a reverse-biased Schottky barrier by placing a metal gate electrode directly on the semiconductor. Such a device is called a metal-semiconductor FET (a MESFET). Typically, the MESFET is formed on an n-type GaAs layer grown epitaxially on a semi-insulating substrate and may or may not include other layers such as a buffer layer, positioned between the substrate and the n-type layer, or a contact layer, positioned between the n-type layer and ohmic drain and source contacts. A Schottky barrier gate is formed on top of the n-type GaAs layer. By reverse-biasing or forward-biasing the Schottky gate, the channel can be depleted or opened to a desired current level.

By using GaAs instead of Si, a higher electron mobility is available and GaAs can be operated at higher temperatures and, therefore, higher power levels. Close geometric tolerances can be achieved, and the MESFET can be very small, with gate lengths $L<1\mu m$ being common. This is important at high frequencies, since drift time and capacitances must be kept to a minimum.

One of the enduring problems in GaAs MESFET technology, however, is the relatively low Schottky barrier height $\phi_B$) of metals used for the gate contact. On the n-type GaAs the $\phi_B$ is basically insensitive to the metal used, with the values being typically in the range 0.71–0.8 eV. This is a limiting factor in the design of many GaAs circuits and the availability of a contact with a large barrier height would allow fabrication of digital logic circuits with better noise margins. Some applications of GaAs MESFET technology would benefit from an increase in the relatively low Schottky barrier height ($\phi_B$) of metals used for the gate contact. A further advantage would be the relaxed requirement on the uniformity of threshold voltage of the component MESFETs.

A number of different approaches to increasing the Schottky barrier height have been attempted. For example, an incorporation of a thin fully-depleted p-type layer under the gate contract on n-GaAs leads to an enhancement of the $\phi_B$. Values up to 1.33 eV have been demonstrated using 50 Å thick C or Zn delta-doped p type layers ($\sim 6-7 \times 10^{19}$ cm$^{-3}$) epitaxially grown on the n-type GaAs. See S. J. Eglash et al., *Journal of applied Physics*, Vol. 61, No. 11, 1 Jun. 1987, pp. 5159-5169. Another approach consists of depositing a thin interfacial layer of Si or other materials between the n-type GaAs and the metal contact. Barrier heights of 1 eV have been demonstrated by this technique. See J. R. Waldrop and R. W. Grant, *Appl. Phys. Lett.*, Vol. 52, No. 21, (23 May 1988) p. 1794-1796. However, these techniques complicate the manufacture of MESFETs and may bring unexpected undesirable effects.

The role of a thin layer of native oxide, e.g. of the order of 20-25 Å in thickness, in degrading the properties of alloyed ohmic contacts on GaAs has been widely recognized; however, less attention has been paid to its effects on Schottky contacts. Woodall's effective work function model, see J. M. Woodall and J. L. Freeouf, *J. Vac. Sci. Technol.*, Vol. 21, No. 2, (July/August 1982) pp. 574-576, suggests that the Fermi level at the interface is not fixed by surface states but rather is related to work functions of microclusters of one or more interfacial phases resulting from either oxygen contamination or metal-semiconductor reactions which occur during metallization. Thus, with an oxide-free interface, the Schottky barrier height of a metal contact should be dependent on the metal work function.

SUMMARY OF THE INVENTION

This invention is the production of MESFET devices with enhanced Schottky barrier contacts. The gate contact is produced by a wet-chemical etching of the n-type GaAs in a sealed inert gas ambient to remove native oxide on GaAs, blowing-drying the etched surface with inert gas, followed by electron beam evaporation deposition of Pt as a gate metal in the inert gas atmosphere. This procedure leads to a high barrier height (0.98 eV) for a Pt gate contact. A major disadvantage of using Pt on MESFETs is its relatively high sheet resistance. This can be overcome by using a multilayer gate contact of Pt with a metal having lower sheet resistance, such as a bilayer of PtAu.

The use of wet-chemical cleaning and blow-drying of the cleaned surface with inert gas in a sealed nitrogen ambient prior or gate metal deposition, together with the use of Pt contacts, leads to MESFETs with reduced gate leakage currents in comparison to the more conventional TiPtAu gate processed devices. This results from the larger enhanced barrier height of Pt with respect to Ti. The use of Pt layer with at least one layer of metal having lower sheet resistance, such as a PtAu bilayer to reduce the gate resistance, eliminates the problem of relatively high sheet resistance of Pt.

DETAILED DESCRIPTION

Figure 1:
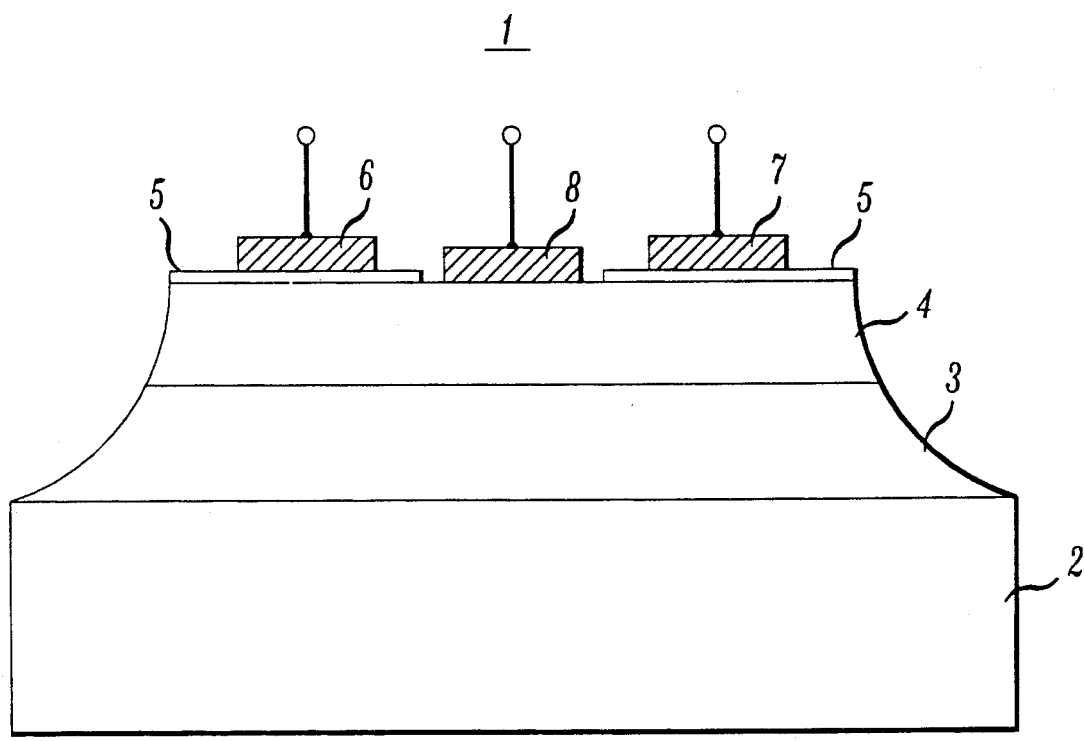
FIG. 1 is a schematic representation of an exemplary MESFET device.

In FIG. 1 is shown an exemplary MESFET device, 1, including a GaAs substrate, 2, a buffer layer, 3, an n-type channel layer, 4, an n+-type contact layer, 5, a drain and a source ohmic contacts, 6 and 7, respectively, and a gate contact, 8, upon a region of the n-type channel layer 4. No diffusions are involved, permitting small gate lengths, $L < 1 \mu m$.

Semi-insulating GaAs substrates, used in these MESFETs, were grown by the Horizontal Bridgman technique, and were uniformly doped with Si to give a net carrier density of $2 \times 10^{17}$ cm$^{-3}$. The MESFET structures were grown on semi-insulating GaAs substrates by atmospheric pressure organic-metallic vapor phase epitaxy (OMVPE). Buffer layer 3 was 1500 Å thick undoped GaAs layer and channel layer 4 was a 1500 Å thick n-type GaAs layer doped with Si ($2 \times 10^{17}$ cm$^{-3}$). Contact layer 5 was a 1000 Å thick n+type Si-doped. ($2 \times 10^{18}$ cm$^{-3}$) GaAs layer. Other thicknesses of these layers may be used for example, the buffer layer may be from 0 to a few micrometers thick, the channel layer may be from 500 to 5,000 Å thick depending on the doping level and threshold voltage, and the contact layer may be from 200 to 3000 Å thick. The ohmic drain and source contacts 6 and 7, respectively, were formed by electron-beam evaporation of Ni/Au-Ge/Mo/Au metal patterned by lift-off AZ resist, followed by rapid thermal annealing at 420° C. for 20 sec. Gate contact 8 was defined by etching away a region of n+type contact layer 5 down to the n-type GaAs layer and deposition on the n-type region a layer of metal in an inert gas-sealed electron beam evaporator. The etchant for the contact layer was an $H_2O_2/H_2O$ mixture in a ratio of 4:1, with pH adjusted by $NH_4OH$ to a value of about 7.2.

The gate metal was deposited on the surface of the n-type GaAs by electron-beam evaporation. Prior to loading the wafer into the inert gas-sealed evaporator, the sample was placed in an inert gas-sealed environment similar to that of the evaporator, and any native oxide present on the n-type gate region was removed by immersing the sample in an aqueous ammonium hydroxide solution ($NH_4OH/H_2O$ ratio ranging from 1:5 to 1:50) for 30 sec, followed by blow-drying the sample with filtered dry inert gas in the same inert gas-sealed environment. An important requirement for the filtered inert gas is substantial absence of water in the gas and such blow-during of at least the surface of the gate region that the presence of water is precluded or at least restricted to a thickness equivalent to 0.5 monolayer or less. Thereafter the etched sample was transferred into the evaporator without breaking the inert gas-seal, wherein the gate electrode metal was deposited by electron beam evaporation in a known manner in a thickness from 200 to 5000 Å. Nitrogen is the preferred inert gas both for the inert gas-sealed environment and for the blow-drying. Other inert gases such as argon, helium, carbon dioxide are suitable for this purpose.

In the specific example of the exemplary procedure, the metal for the gate contact was selected from Ni and Pt both of which have high work function. See E. H. Rhoderick and R. H. Williams "Metal-Semiconductor Contacts," *Oxford Science Publications*, Oxford, 2nd Ed., 1988, p. 10–11, and 48. The Ni or Pt metallization, deposited with this oxide-removing procedure as a layer 1500 Å thick each was compared with a) 1500 Å Pt and Ni metallizations produced using a cleaning procedure in which the wet-chemical cleaning took place in an air ambient immediately followed by the loading of the sample into the inert gas-sealed evaporator, and b) TiPtAu gate, Ti(250 Å/Pt (500 Å)/Au(3000 Å), contacts deposited on large area (200 μm diameter) Schottky diodes using the conventional cleaning technique which includes wet-chemical etching in air. Bilayer PtAu metallizaitons, Pt(800 Å)/Au(300 Å), deposited on gate region samples cleaned in nitrogen-sealed ambient as well as the TiPtAu metallizations, Ti(250 Å)/Pt(500 Å)/Au(3000 Å), deposited on samples cleaned with conventional cleaning were applied on GaAs MESFETs with gate dimensions of $1 \times 30$ μm$^2$. Barrier heights, $\phi_B$ (eV), and ideality, n, of diodes with gates produced with these different procedures are disclosed in Table I below.

TABLE 1

| Metal | Cleaned in Open Air $\phi_B$(eV) | n | Cleaned in $N_2$ Sealed Ambient $\phi_B$(eV) | n | Work Function (eV) |
|---|---|---|---|---|---|
| Ni | 0.68 | 1.11 | 0.57 | 1.15 | 5.15 |
| Pt | 0.79 | 1.11 | 0.98 | 1.13 | 5.65 |
| Reference Ti/Pt/Au | 0.78 | 1.03 | — | — | |

The Schottky barrier height characteristics were evaluated with a Hewlett-Packard parameter analayzer and were fitted to the standard equation assuming that thermionic emission was the dominant condition mechanism. Both Ni and Pt contacts produced with conventional preparation (wet etching in air ambient) show a common ideality factor of 1.11 and barrier heights of 0.68 and 0.79 eV, respectively. In these cases, the oxide clearly plays a dominant role. For wafers prepared by wet cleaning and blow-drying in a sealed $N_2$ ambient, the Ni contact showed an unexpectedly low $\phi_B$ of 0.57 eV and an ideality factor of 1.11, while the Pt contact displayed a barrier height of 0.98 eV with an ideality factor of 1.13. Although the barrier heights of these contacts do not precisely follow the Shottky model, they are definitely related to the metal work functions, as illustrated in Table 1. The barrier height for conventional TiPtAu metallization was 0.78 eV, with an ideality factor of 1.03. This is typical of this metallization scheme and cleaning procedure. This comparison shows that with this cleaning technique in an inert ambient and its higher metal work function, Pt is useful as gate metal on GaAs.

Pt may be used as a gate contact by itself, but because of relatively high sheet resistivity of the metal, it may be used as a base metal for other metals having lower sheet resistivity such as gold, titanium, aluminum, and others. In such instances, platinum may be deposited as a thin layer, e.g. 200 to 2000 Å thick followed by a relatively thick layer, e.g. from 1000 to 5000 Å, of a metal with lower sheet resistivity and which may have lower work function. An example of such combination is a bilayer PtAu metallization.

Figure 2:
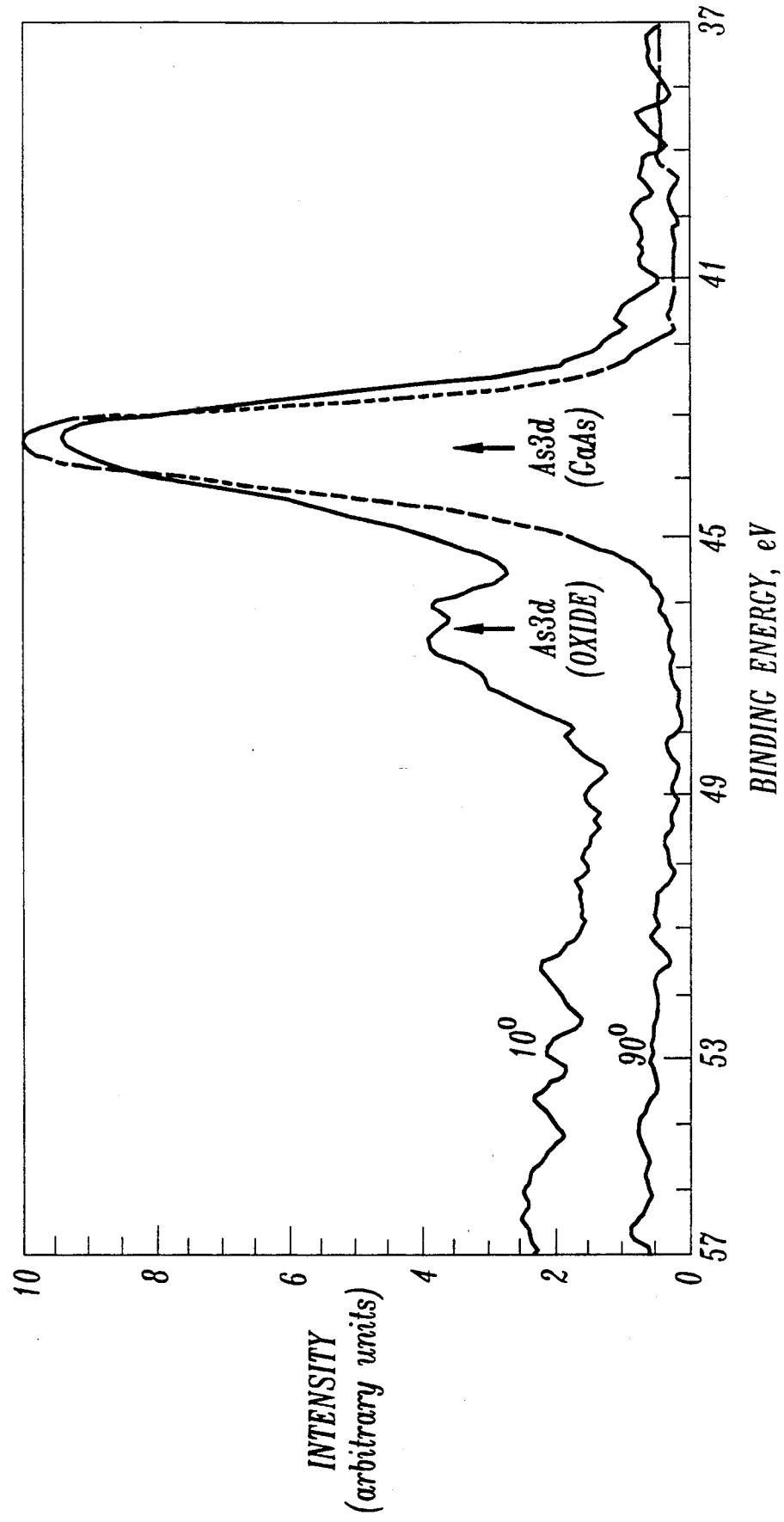
FIG. 2 is a representation of an x-ray photoelectron spectroscopy (XPS) at two different XPS take-off angles of GaAs cleaned in air atmosphere (dashed line-high angle—90°, solid line-low angle —10°)
Figure 3:
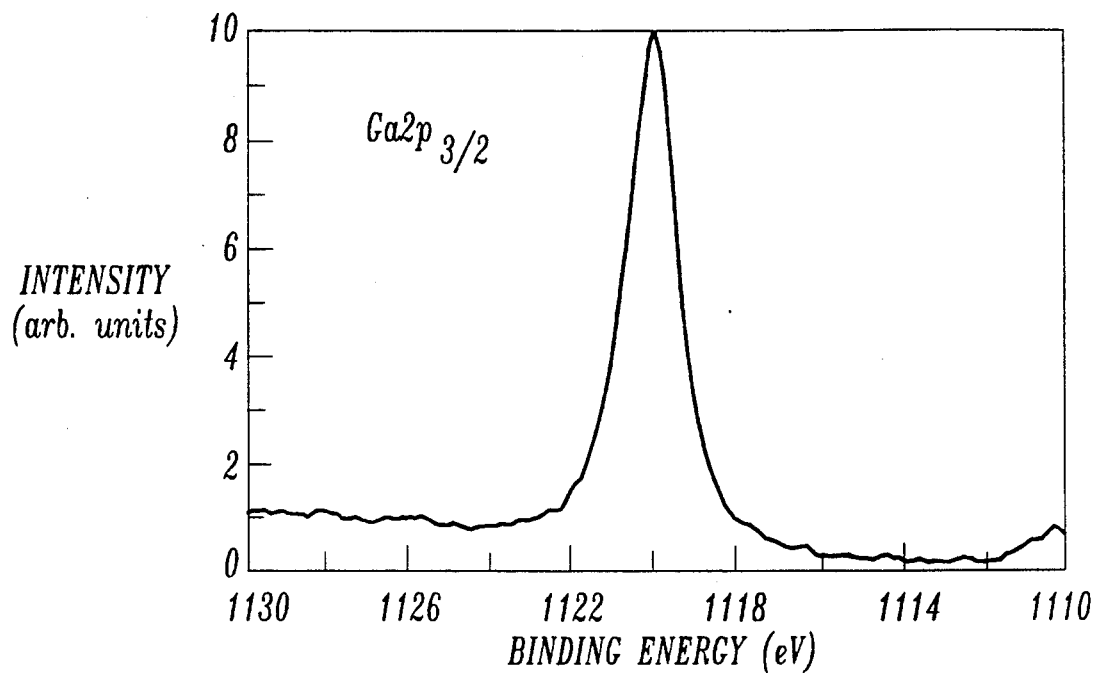
FIGS. 3 and 4 are each a representation of an XPS spectra of GaAs cleaned in sealed nitrogen ambient, showing an essentially oxide free surface.
Figure 4:
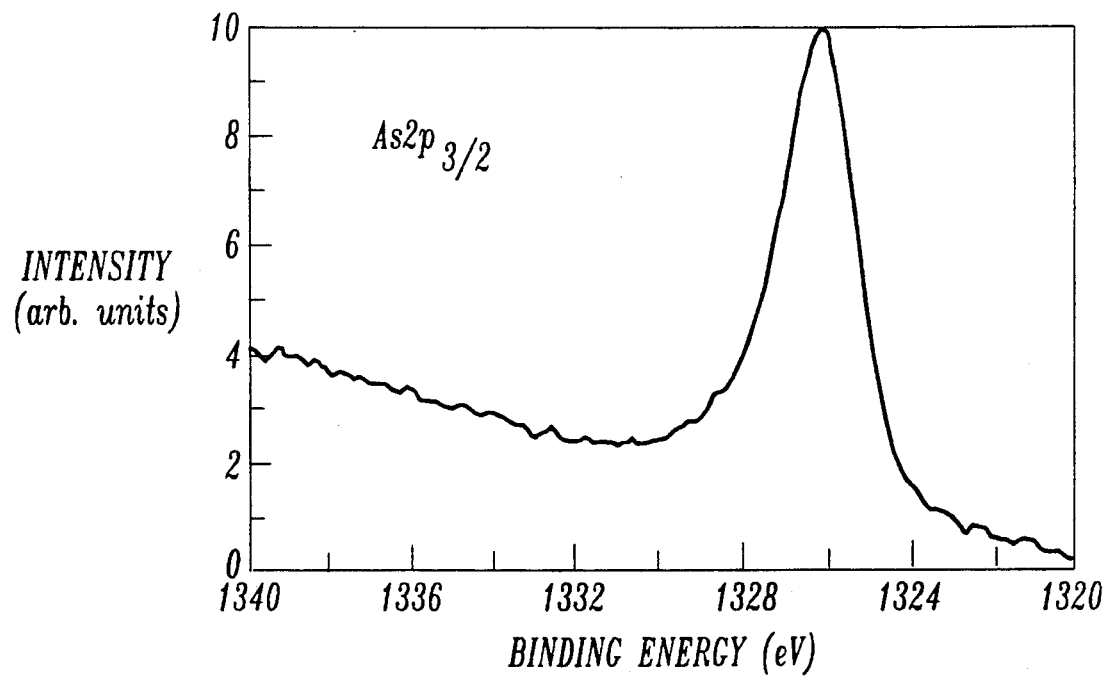

FIG. 2 shows the XPS spectra at two different take-off angles from the sample cleaned by the conventional method. The lower take-off angle(10°) permits sampling of only about ⅓ of the depth of 30–40 Å on the high angle (90°) specimen. The oxide peak was greatly enhanced at glancing (low) angle showing that the oxide existed on the surface only within a few monolayers. In contrast, XPS spectra of GaAs cleaned and blown-dry with nitrogen in the sealed nitrogen ambient shows an essentially oxide free surface, as illustrated in FIGS. 3 and 4. These spectra were taken from different lines (different binding energies) than those of FIG. 2, and are even more sensitive, sampling only the top 2 or 3 monolayers of the etched surface.

Figure 5:
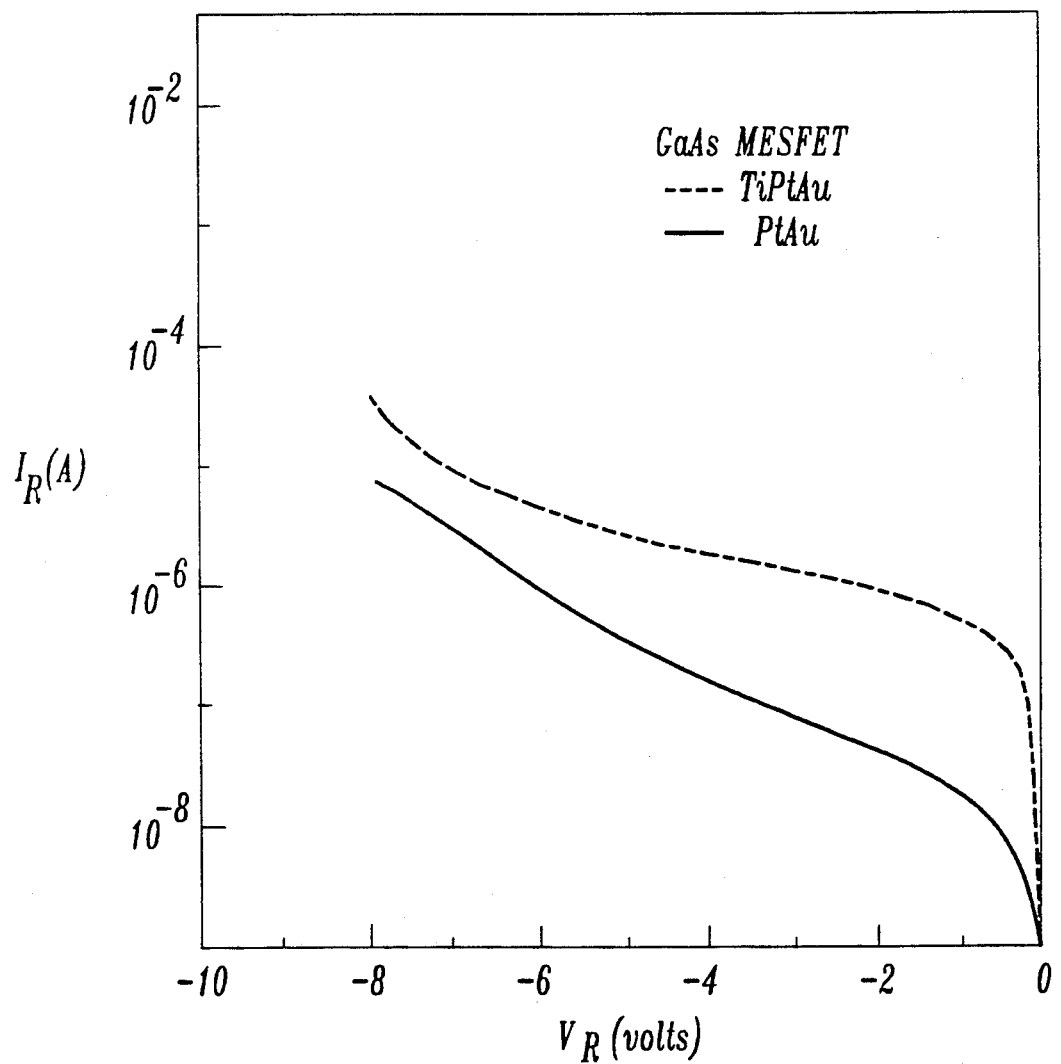
FIG. 5 is a representation of a reverse bias current from GaAs MESFETs utilizing either the modified PtAu metal or conventional TiPtAu as the gate metal.
Figure 6:
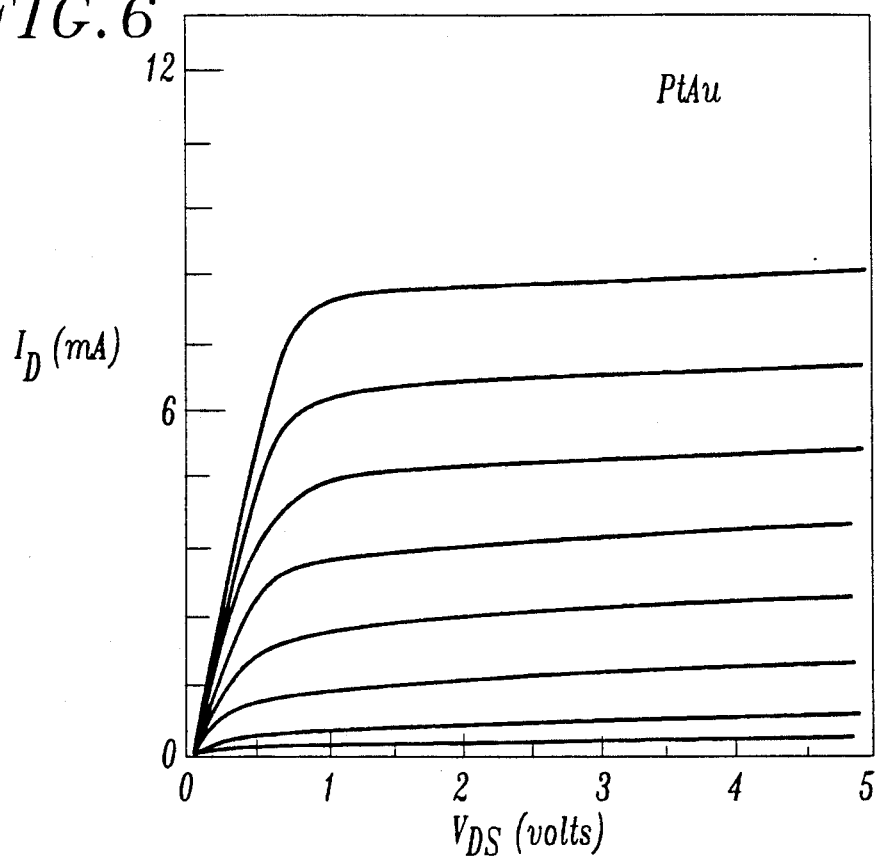
FIGS. 6 and 7 are each a representation of $I_D$-31 $V_{DS}$ characteristics from GaAs MESFETs utilizing, respectively, either the modified PtAu or conventional TiPtAu as the gate metal.
Figure 7:
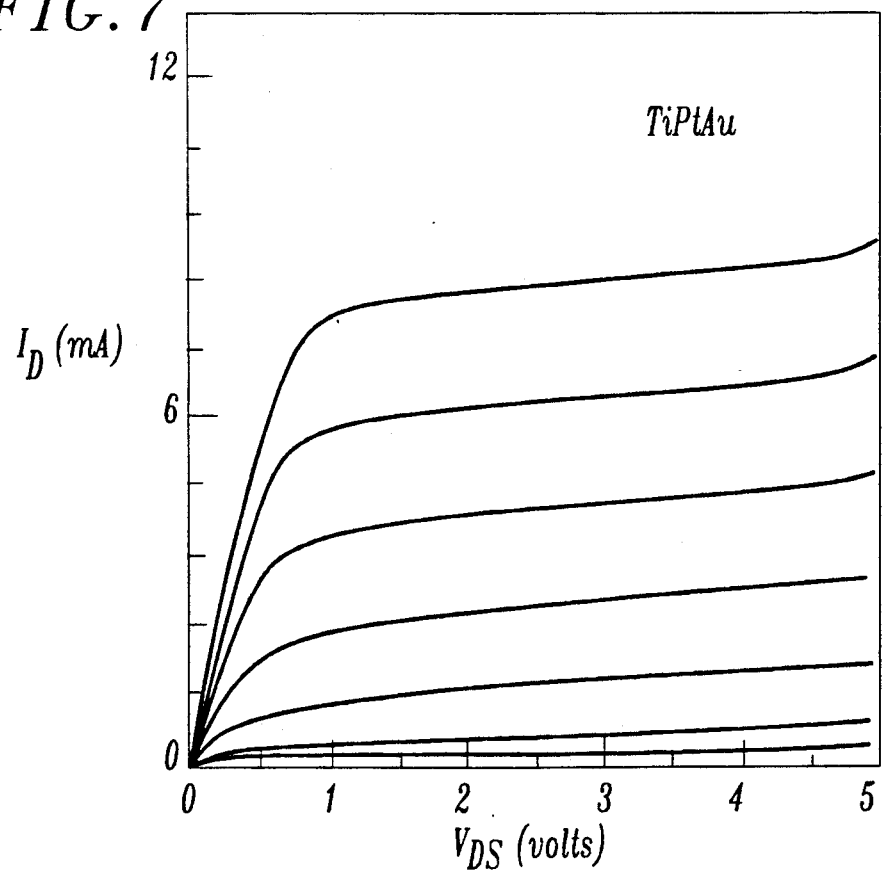
Figure 8:
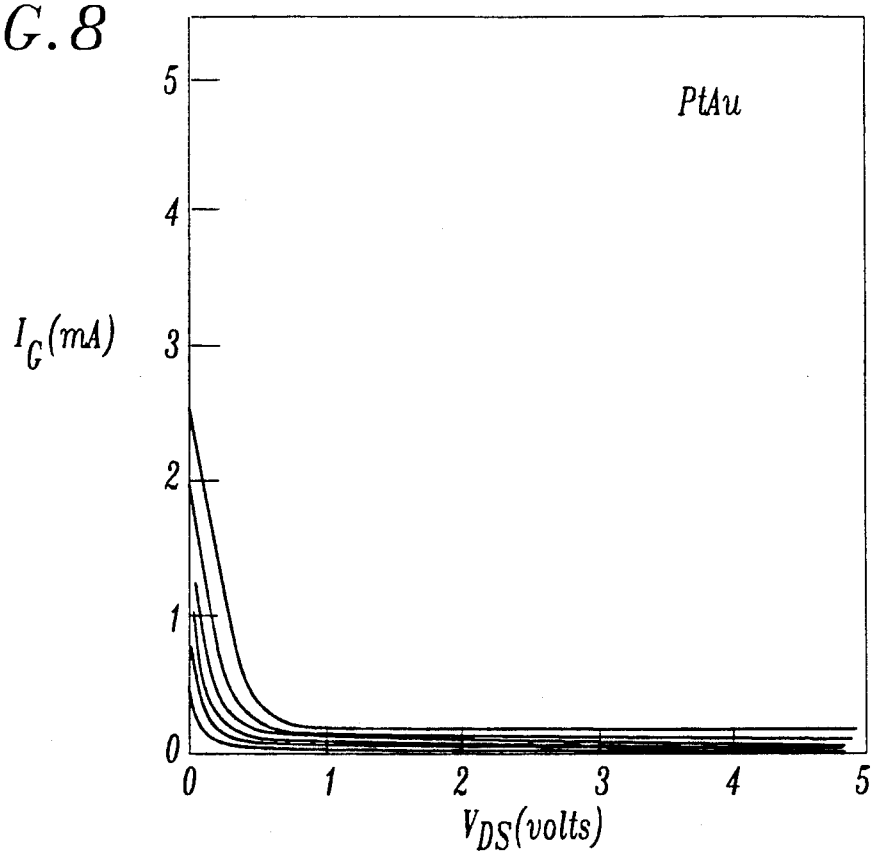
FIGS. 8 and 9 are each a representation of a gate leakage current, $I_G$, as a function of $V_{DS}$ for the GaAs MESFETs of FIGS. 6 and 7 (PtAu gate metal) and FIGS. 6 and 8 (TiPtAu gate metal), respectively.
Figure 9:
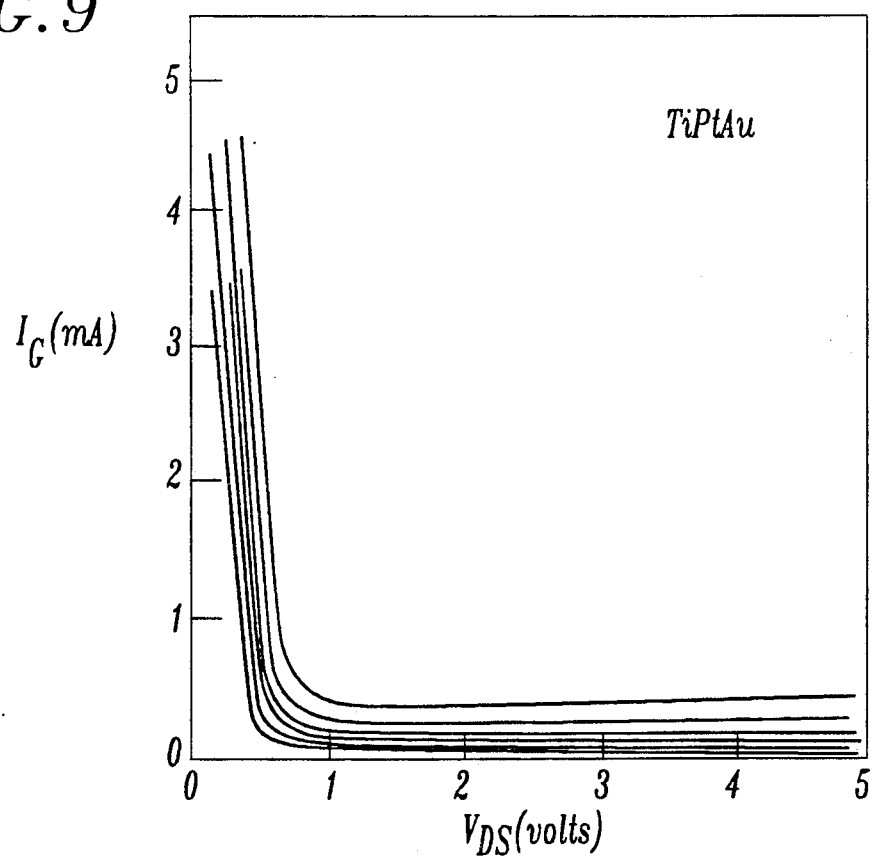

FIG. 5 compares the reverse bias characteristics of MESFETs with the bilayer PtAu (solid line) gate metal with those of the conventional TiPtAu (dashed line). Up to a reverse bias of 5 V, the current in the device using the Pt Au metallization is an order of magnitude lower than in the case of the TiPtAu gate metal. The drain current ($I_d$)-drain source voltage ($V_{ds}$) characteristics from both MESFETs as a function of gate voltage (Vg) are shown in FIGS. 6 and 7, respectively. These characteristics were measured in 0.25 V steps for MESFETs with PtAu gate metallization with $V_g=0.8$ to -0.949 V and for MESFETs with TiPtAu with $V_g=0.8$ to 0.699 V. The device with the PtAu gate has better saturation behavior (FIG. 6); for example, its output resistance is higher and there is no sign of breakdown which is seen in device with the TiPtAu gate (right hand portion of FIG. 7). The forward bias gate currents were also lower at a given voltage for MESFET with the PtAu gate (FIG. 8) than for the MESFET with the TiPtAu gate, (FIG. 9). the $V_g$ for both the PtAu and the TiPtAu contacts were measured with $V_g=0.8$ to 0.674 V in 0.25 V steps. These facts are consistent with the large barrier height for PtAu. The significantly lower leakage currents and device performance improvement emphasize the advantage of the oxide removal procedure in accordance with this invention and the use of Pt metallization in direct contact with the GaAs surface cleaned by this procedure.

We claim:

1. The method of fabricating a GaAs MESFET device comprising a semiconductor substrate, a n-type GaAs channel layer, an n+-type GaAs contact layer, a drain and a source ohmic contacts on a surface of the n+GaAs layer, and a gate contact on a surface of the n-type GaAs channel layer forming a Schottky barrier contact with the n-type GaAs layer; which comprises forming said gate contact by evaporation of a metal multilayer structure comprising a Pt layer on a gate region of the n-type GaAs layer in an inert gas-sealed ambient in which said inert gas is chosen from the group consisting of argon, helium, nitrogen and carbon dioxide, wherein said Pt layer is in direct contact with the surface of the n-type GaAs, and wherein prior to the evaporation of the gate contact, a partially fabricated device is placed into the inert gas-sealed ambient, the n-type GaAs surface of the gate region is wet etched, and the wet etched surface is blow-dried with the inert gas.

2. The method of claim 1 in which said inert gas is nitrogen.

3. The method of claim 1, in which said multilayer structure includes at least one further layer of another metal overlaying the Pt layer, said another metal having lower sheet resistivity than the Pt layer.

4. The method of claim 3, in which sand another metal is selected from the group consisting of gold, aluminum and titanium.

5. The method of claim 4, in which Pt layer is from 200 to 2000 Å thick and said another layer is from 1000 to 5000 Å in thickness.

6. The method of claim 3, in which said multilayer structure is a bilevel PtAu contact.

7. The method of claim 6, in which the Pt layer is 800 Å thick and Au layer is 3000 Å thick.

8. The method of fabricating a Schottky barrier contact on a surface of an n-type GaAs layer, which comprises forming said contact by evaporation of a metal multilayer structure comprising a Pt layer on a surface of a region of the n-type GaAs layer in an inert gas sealed environment in which said inert gas is chosen from the group consisting of argon, helium, nitrogen and carbon dioxide, wherein said Pt layer is deposited in direct contact with the surface of the n-type GaAs layer, and wherein, prior to the evaporation of the multilayer structure on the said surface, the n-type GaAs layer is placed into the inert gas-sealed ambient, the n-type GaAs surface of the gate region is wet etched, and the wet etched surface is blow-dried with the inert gas.

9. The method of claim 8 which said inert gas is nitrogen.

10. The method of claim 8, in which said multilayer structure includes at least one further layer of another metal overlying the Pt layer, said another metal having lower sheet resistivity than the Pt layer.

11. The method of claim 10, in which said another metal is selected from the group consisting of gold, aluminum and titanium.

12. The method of claim 11, in which Pt layer is from 200 to 20000 Å thick and said another metal layer is from 1000 to 5000 Å in thickness.

13. The method of claim 10, in which said multilayer structure is a bilevel PtAu contact.

14. The method of claim 13, in which Pt layer is 800 Å thick and Au layer is 3000 Å thick.

* * * * *

UNITED STATES PATENT AND TRADEMARK OFFICE
CERTIFICATE OF CORRECTION

PATENT NO. : 5,106,771
DATED : April 21, 1992
INVENTOR(S) : Adrian B. Emerson and Fan Ren It is certified that error appears in the above-identified patent and that said Letters Patent is hereby corrected as shown below:

Column 2, line 61, replace "$I_{D-31}V_{DS}$" with --$I_D$-$V_{DS}$--.

Column 6, line 9, replace "sand" with --said--.

Column 6, line 45, replace "20000" with --2000--.

Signed and Sealed this

Twentieth Day of September, 1994

Attest:

BRUCE LEHMAN

Attesting Officer

Commissioner of Patents and Trademarks